(12) United States Patent
Nakashima et al.

(10) Patent No.: US 11,056,357 B2
(45) Date of Patent: Jul. 6, 2021

(54) SUBSTRATE PROCESSING APPARATUS AND SUBSTRATE PROCESSING APPARATUS ASSEMBLING METHOD

(71) Applicant: TOKYO ELECTRON LIMITED, Minato-ku (JP)

(72) Inventors: Mikio Nakashima, Koshi (JP); Katsuya Koga, Koshi (JP)

(73) Assignee: TOKYO ELECTRON LIMITED, Minato-ku (JP)

(*) Notice: Subject to any disclaimer, the term of this patent is extended or adjusted under 35 U.S.C. 154(b) by 493 days.

(21) Appl. No.: 15/423,815

(22) Filed: Feb. 3, 2017

(65) Prior Publication Data
US 2017/0229324 A1 Aug. 10, 2017

(30) Foreign Application Priority Data
Feb. 4, 2016 (JP) .............................. JP2016-019830

(51) Int. Cl.
*H01L 21/67* (2006.01)
*B08B 3/02* (2006.01)
*B08B 3/04* (2006.01)

(52) U.S. Cl.
CPC .......... *H01L 21/67051* (2013.01); *B08B 3/02* (2013.01); *B08B 3/022* (2013.01); *B08B 3/04* (2013.01); *H01L 21/6708* (2013.01); *H01L 21/6719* (2013.01); *H01L 21/67253* (2013.01); *B08B 2203/0229* (2013.01)

(58) Field of Classification Search
CPC ........... H01L 21/67051; H01L 21/6708; H01L 21/02052; H01L 21/02307; H01L 21/02343; H01L 21/6715; H01L 21/6719; H01L 21/67253; H01L 21/67703; B08B 3/022; B08B 3/04; B08B 2203/0229; B08B 3/02
See application file for complete search history.

(56) References Cited

U.S. PATENT DOCUMENTS 4,098,326 A * 7/1978 Waters ................ F28D 15/0275
138/112
5,629,831 A * 5/1997 Eggert ................. H01R 9/2658
361/624

(Continued)

FOREIGN PATENT DOCUMENTS

JP  2000-120530 A     4/2000
JP  2006114607 A *    4/2006 ............. G03F 7/162

(Continued)

OTHER PUBLICATIONS

Machine translation of JP2006-114607A (Year: 2006).*

*Primary Examiner* — Douglas Lee
(74) *Attorney, Agent, or Firm* — Oblon, McClelland, Maier & Neustadt, L.L.P.

(57) ABSTRACT

A substrate processing system includes multiple assemblies framed and including such that each of the assemblies includes a substrate processing apparatus which supplies a processing fluid to a substrate and processes the substrate, a fluid supply control apparatus including a fluid control device which controls flow of the processing fluid supplied to the substrate processing apparatus, and a drive equipment apparatus including a drive device which drives movement of the fluid control device in the fluid supply control apparatus.

20 Claims, 5 Drawing Sheets

(56) References Cited

U.S. PATENT DOCUMENTS

| | | | |
|---|---|---|---|
| 7,353,841 B2 | 4/2008 | Kono et al. | |
| 2012/0160279 A1* | 6/2012 | Konishi | H01L 21/67051 |
| | | | 134/99.1 |

FOREIGN PATENT DOCUMENTS

| | | |
|---|---|---|
| JP | 2008-034490 A | 2/2008 |
| JP | 2010-147212 A | 7/2010 |
| JP | 2012-142405 A | 7/2012 |
| WO | WO 2004/109420 A1 | 12/2004 |

* cited by examiner

SUBSTRATE PROCESSING APPARATUS AND SUBSTRATE PROCESSING APPARATUS ASSEMBLING METHOD

CROSS-REFERENCE TO RELATED APPLICATIONS

The present application is based upon and claims the benefit of priority to Japanese Patent Application No. 2016-019830, filed Feb. 4, 2016, the entire contents of which are incorporated herein by reference.

BACKGROUND OF THE INVENTION

Field of the Invention

The present invention relates to a technology for supplying a processing liquid to multiple substrate processing units in a substrate processing apparatus having the substrate processing units.

Description of Background Art

In manufacturing a semiconductor device, various liquid processing processes such as a wet etching process and a chemical cleaning process are performed with respect to a substrate to be processed such as a semiconductor wafer. Such liquid processing processes are performed using a substrate processing system in which multiple liquid processing units (substrate processing units) are incorporated in one housing. The liquid processing units each have, for example, a spin chuck that holds and rotates a wafer and a processing liquid discharge nozzle. A processing liquid is supplied from a processing liquid supply part to the multiple liquid processing units.

The processing liquid supply part has a tank that stores a processing liquid, a circulation line that is connected to the tank, branch lines that are branched from the circulation line and respectively supply the processing liquid to the liquid processing units, and fluid control devices such as a flow meter, a flow control valve and an on-off valve that are provided in each of the branch lines for controlling a supply state with respect to a corresponding liquid processing unit (for example, see Japanese Patent Laid-Open Publication No. 2008-034490). The entire contents of this publication are incorporated herein by reference.

SUMMARY OF THE INVENTION

According to one aspect of the present invention, a substrate processing system includes multiple assemblies framed and including such that each of the assemblies includes a substrate processing apparatus which supplies a processing fluid to a substrate and processes the substrate, a fluid supply control apparatus including a fluid control device which controls flow of the processing fluid supplied to the substrate processing apparatus, and a drive equipment apparatus including a drive device which drives movement of the fluid control device in the fluid supply control apparatus.

According to another aspect of the present invention, a method for assembling a substrate processing system includes forming multiple assemblies including such that each of the assemblies includes a substrate processing apparatus which supplies a processing fluid to a substrate and processes the substrate, a fluid supply control apparatus including a fluid control device which controls flow of the processing fluid supplied to the substrate processing apparatus, and a drive equipment apparatus including a drive device which drives movement of the fluid control device in the fluid supply control apparatus, connecting, to each of the assemblies, a test equipment device which controls operation of each of the assemblies such that each of the assemblies is inspected, and assembling the assemblies inspected by the test equipment device onto a frame structure such that a substrate processing system including the assemblies is assembled.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1:
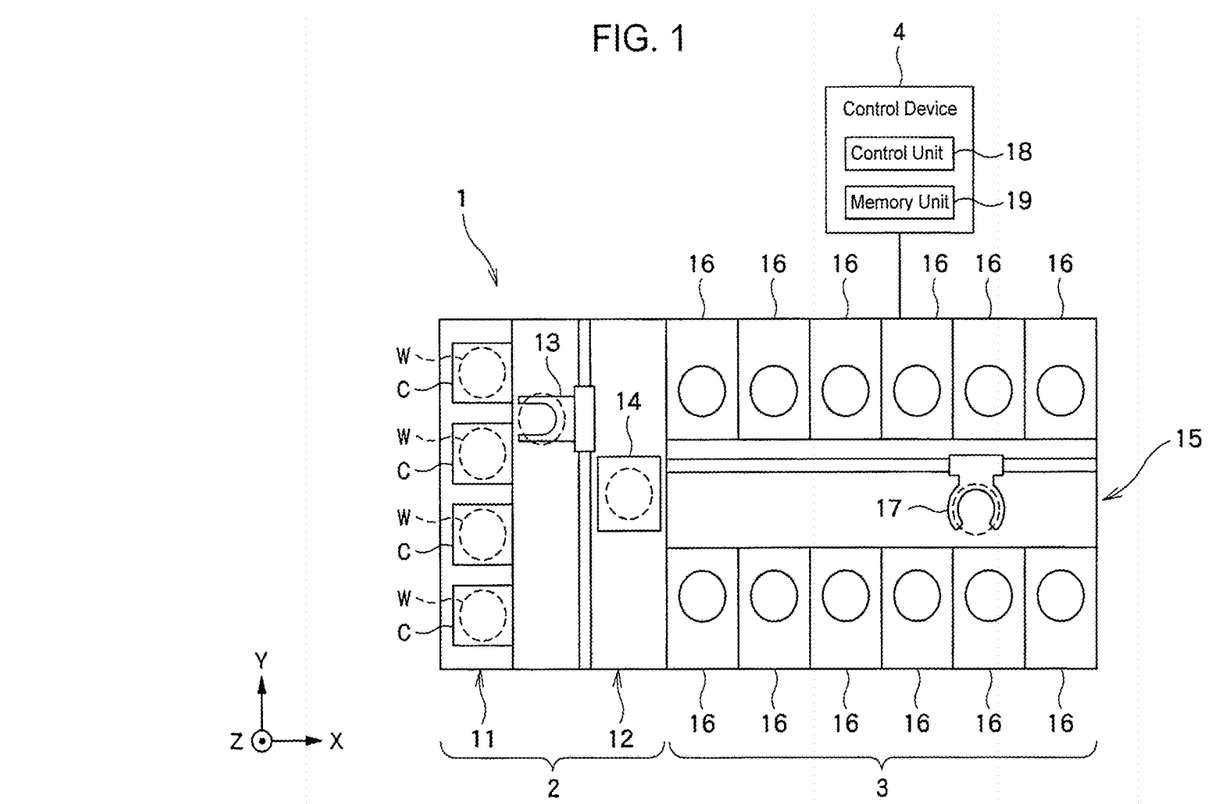
FIG. 1 is a schematic plan view illustrating a structure of a substrate processing system.

FIG. 1 is a view schematically showing the structure of a substrate processing system according to a first embodiment. In the following, X, Y and Z axes intersecting each other at right angles are specified to clarify positional relationships, and a positive direction of the Z axis is set as the vertically upward direction.

As shown in FIG. 1, substrate processing system 1 is provided with loading station 2 and processing station 3. Loading station 2 and processing station 3 are positioned to be adjacent to each other.

Loading station 2 includes carrier mounting zone 11 and transport zone 12. Multiple carriers (C), which accommodate multiple wafers (W) (substrates) horizontally, are mounted in carrier mounting zone 11.

Transport zone 12 is positioned adjacent to carrier mounting zone 11, and is provided with substrate transport device 13 and delivery table 14. Substrate transport device 13 has a substrate holding mechanism for holding a wafer (W). Substrate transport device 13 is capable of moving horizontally and vertically as well as rotating around the vertical axis, and transports a wafer (W) between a carrier (C) and delivery table 14 using the substrate holding mechanism.

Processing station 3 is positioned adjacent to transport zone 12. Processing station 3 includes transport zone 15 and multiple processing units 16. Multiple processing units 16 are aligned on each side of transport zone 15.

Substrate transport device 17 is provided in transport zone 15. Substrate transport device 17 includes a substrate holding mechanism for holding a wafer (W). In addition, substrate transport device 17 is capable of moving horizontally and vertically as well as rotating around the vertical axis, and transports a wafer (W) between delivery table 14 and processing unit 16 using the substrate holding mechanism.

Processing unit 16 conducts predetermined treatments on a wafer (W) transported by substrate transport device 17.

Substrate processing system 1 includes control device 4. Control device 4 is a computer, for example, and includes control unit 18 and memory unit 19. Memory unit 19 stores a program for controlling various treatments carried out in substrate processing system 1. Control unit 18 controls operations to be performed in substrate processing system 1 by reading out and executing the program stored in memory unit 19.

Such a program may be stored in a computer-readable medium and installed from the memory medium onto memory unit 19 of control device 4. Examples of a computer-readable medium are hard disks (HD), flexible disks (FD), compact discs (CD), magneto-optical discs (MO), memory cards and the like.

In substrate processing system 1 structured as above, first, substrate transport device 13 of loading station 2 takes out a wafer (W) from carrier (C) in carrier mounting zone 11, and mounts the wafer (W) on delivery table 14. The wafer (W) mounted on delivery table 14 is unloaded by substrate transport device 17 of processing station 3 to be loaded into processing unit 16.

The wafer (W) loaded into processing unit 16 is treated in processing unit 16 and is unloaded from processing unit 16 by substrate transfer device 17 to be mounted onto delivery table 14. Then, the treated wafer (W) mounted on delivery table 14 is returned by substrate transport device 13 to carrier (C) in carrier mounting zone 11.

Figure 2:
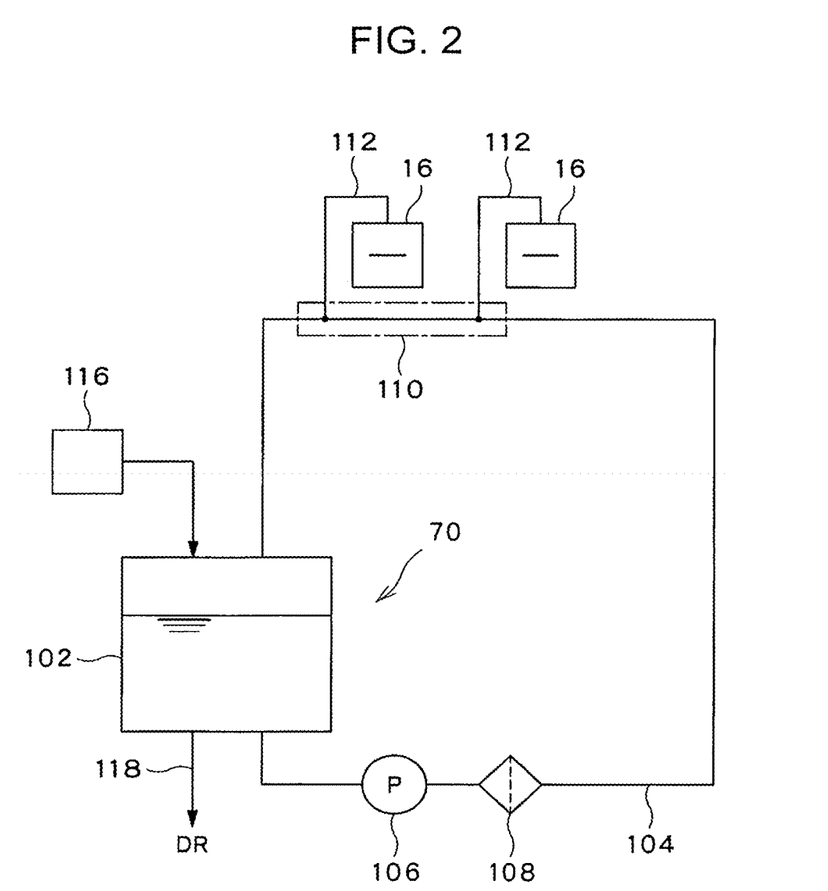
FIG. 2 is a piping diagram illustrating a schematic structure of a processing liquid supply mechanism.

As illustrated in FIG. 2, the substrate processing system 1 has a processing liquid supply device 70 that supplies processing liquids such as an etching solution, a cleaning liquid and a rinse liquid to the processing units 16. The processing liquid supply device 70 has a tank 102 that stores a processing liquid, and a main supply pipe 104 that forms a circulation line that extends out from the tank 102 and extends back to the tank 102. The main supply pipe 104 is provided with a pump 106. The pump 106 forms a circulating flow that leaves the tank 102 and passes through the main supply pipe 104 to return to the tank 102. On a downstream side of the pump 106, the main supply pipe 104 is provided with a filter 108 for removing contaminants such as particles contained in the processing liquid. When necessary, the main supply pipe 104 may be further provided with auxiliary equipment (such as a heater).

One or multiple branch pipes 112 are connected to a connection region 110 set in the main supply pipe 104. The branch pipes 112 respectively supply the processing liquid flowing in the main supply pipe 104 to corresponding processing units 16.

The liquid processing device has a tank liquid replenishing part 116 for replenishing the processing liquid or a processing liquid component to the tank 102. The tank 102 is provided with a drain part 118 for discarding the processing liquid in the tank 102.

FIG. 2 illustrates one processing liquid supply device 70. However, in practice, depending on types of processing liquids used in the substrate processing system 1, multiple processing liquid supply devices 70 are provided.

Figure 3:
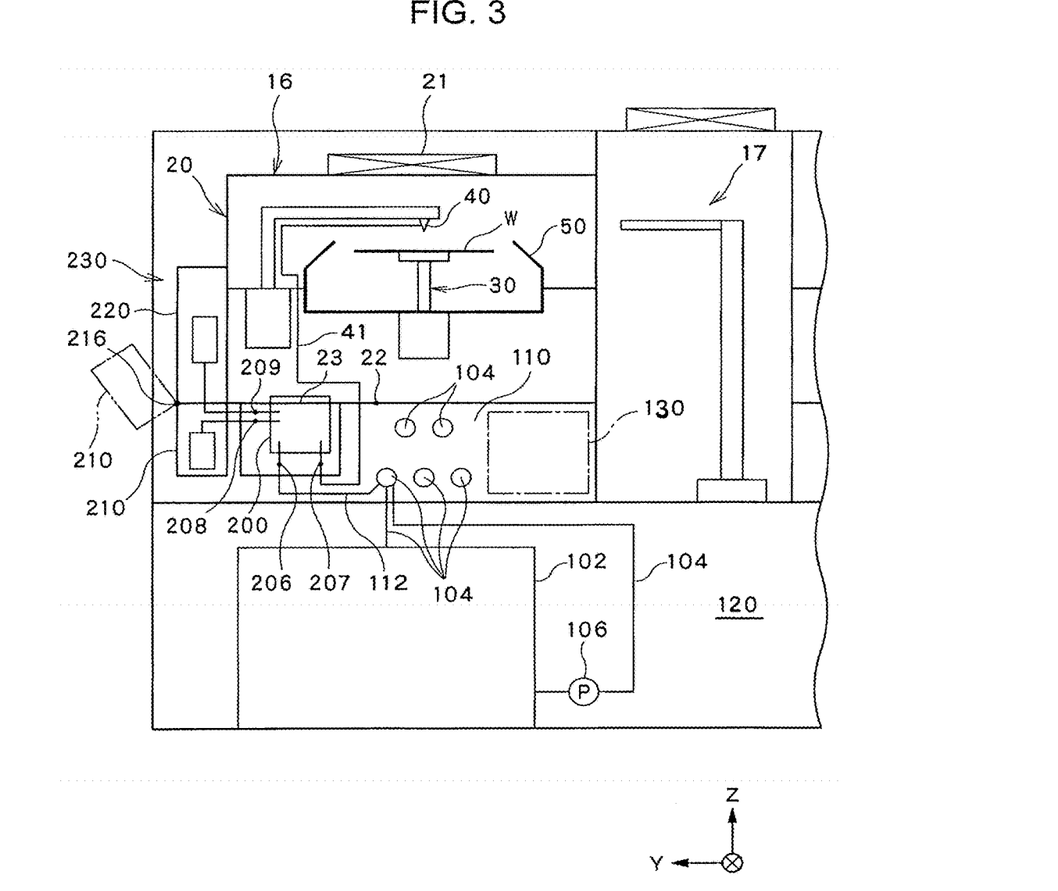
FIG. 3 is a schematic vertical cross-sectional view illustrating one processing unit and a structure of a portion of a processing liquid supply device associated with the processing unit.

FIG. 3 schematically illustrates one of the multiple processing units (substrate processing units) 16 and a structure near the connection region 110 of a processing liquid supply device 70 corresponding to the one of the processing units 16.

As illustrated in FIG. 3, the processing unit 16 includes a chamber 20, a substrate holding mechanism 30 in a form of, for example, a spin chuck arranged in the chamber 20, at least one nozzle 40, and a collection cup 50. The nozzle 40 receives the processing liquid supplied from the branch pipe 112 of the processing liquid supply device 70 and supplies the processing liquid to a wafer (W) held by the substrate holding mechanism 30. On a ceiling of the chamber 20, an FFU (Fan Filter Unit) 21 that forms a down flow in the chamber 20 is provided. The collection cup 50 collects processing liquid scattered from the wafer (W) and discharges the collected processing liquid from a bottom drain port (not illustrated in the drawings). An exhaust port (not illustrated in the drawings) is also provided at the bottom of the collection cup 50.

In space below a front-rear direction central portion of the processing unit 16, multiple main supply pipes 104 extend in parallel to each other in the X direction (a direction perpendicular to a paper surface of FIG. 3), that is, in a horizontal direction parallel to an array direction of the processing unit 16. A processing liquid of a high temperature flows in a main supply pipe 104 on an upper side, and a processing liquid of a normal temperature or a relatively low temperature flows in a main supply pipe 104 on a lower side.

In FIG. 3, bellow an area corresponding to the connection region 110 where the main supply pipe 104 is arranged, that is, the connection region 110 of FIG. 2, a processing liquid storage area 120 where the tank 102, the pump 106 and the like of the processing liquid supply device 70 are arranged is provided. The main supply pipe 104 that extends from the tank 102 extends to a position of a height illustrated in FIG. 3, and then extends in the X positive direction below the first row of the processing units 16 (a row of the processing units 16 on an upper side in FIG. 1), and then extends in the Y negative direction, and then extends in the X negative direction below the second row of the processing units 16 (a row of the processing units 16 on a lower side in FIG. 1), and then extends downward and extends back to the tank 102.

In FIG. 3, in a region 130 on a right side of the connection region 110, for example, a duct that allows exhaust gas to pass and a pipe that allows waste liquid to pass can be provided.

Figure 5:
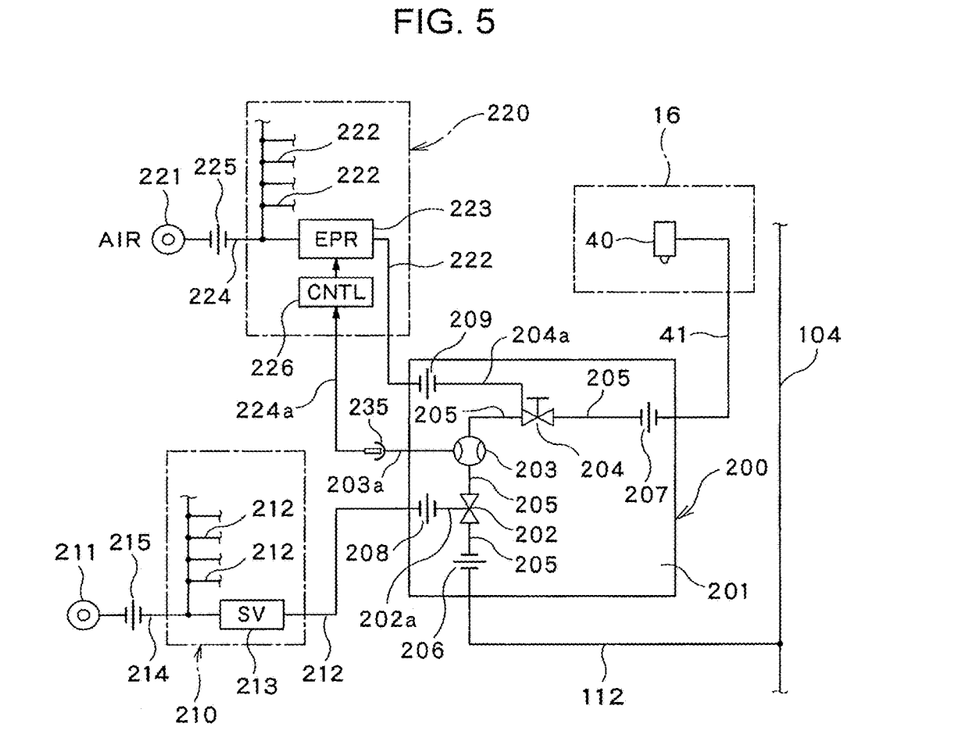
FIG. 5 is a piping diagram illustrating one processing unit and a structure of a portion of a supply control module associated with the processing unit.

As illustrated in FIGS. 3 and 5, from one main supply pipe 104, one or multiple branch pipes 112 are branched toward the processing units 16.

Figure 4:
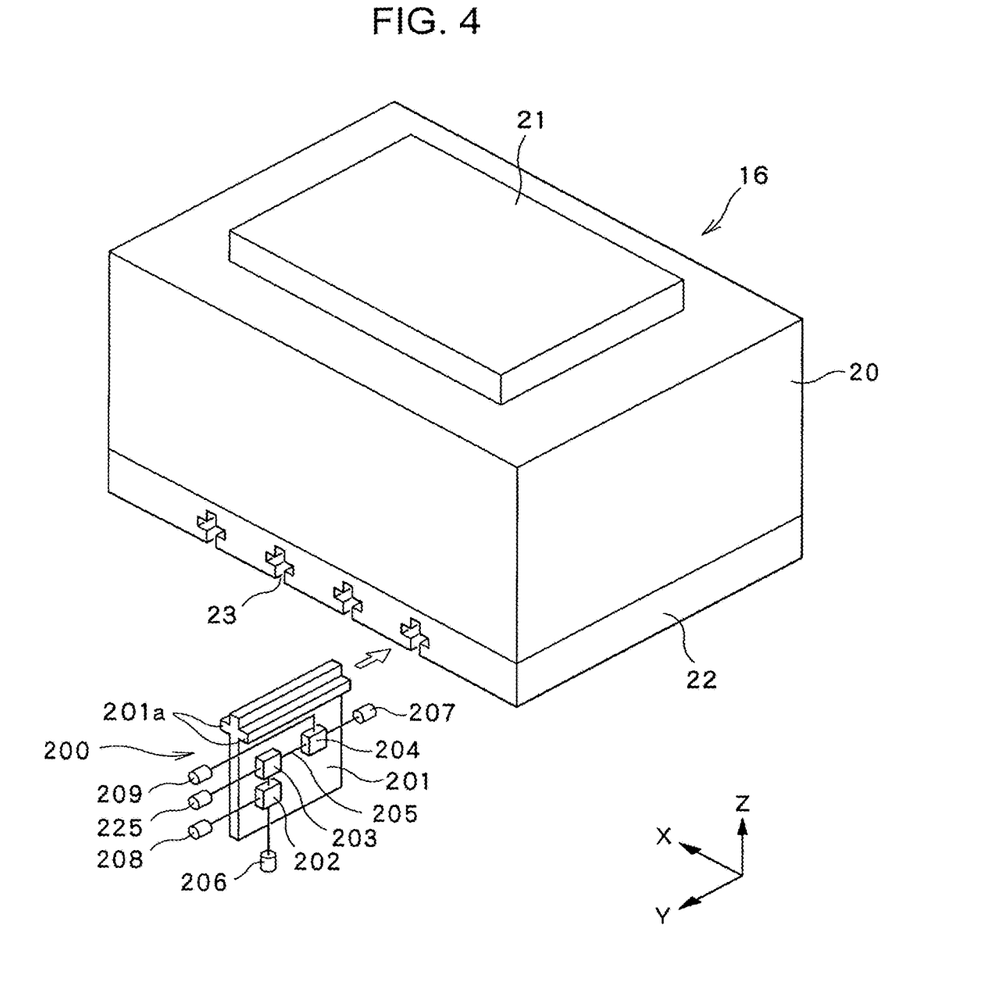
FIG. 4 is a schematic perspective view describing installation of a supply control module to a processing unit.

As illustrated in FIG. 4, on a bottom plate 22 of the processing unit 16, multiple slots 23 are provided, and supply control modules 200 are respectively mounted to the slots 23. The supply control modules 200 are arranged in a direction (the X direction) perpendicular to the paper surface of FIG. 3. By the multiple supply control modules 200 provided in one processing unit 16, a processing liquid supply controller dedicated to this one processing unit 16 (that is, it does not have a part involved in processing liquid supply of other processing units 16) is formed. It is also possible that a processing liquid supply controller dedicated to one processing unit 16 is formed by one supply control module 200.

A module holding part is provided that prevents a supply control module 200 from falling downward and maintains the supply control module 200 in a predetermined position when the supply control module 200 is inserted into a slot 23. In the example illustrated in FIG. 4, on a base plate 201 of the supply control module 200, an overhanging part (201a) that projects from the base plate 201 is provided. Further, when an entrance of a slot 23 is opened and the overhanging part (201a) of the base plate 201 is inserted into the slot 23 from the entrance of the slot 23, the overhanging part (201a) of the base plate 201 is supported from below and the base plate 201 is positioned. Therefore, the supply control module 200 can be prevented from falling downward and the supply control module 200 can be maintained at a predetermined position. That is, a base plate holding part is formed by the slot 23 and the overhanging part (201a).

As illustrated in FIGS. 4 and 5, the supply control module 200 has the base plate 201, fluid control devices such as an on-off valve 202, a flow meter 203 and a flow control valve 204 that are mounted to the base plate 201, and multiple module pipes 205 connecting these fluid control devices.

A most upstream module pipe 205 and a branch pipe 112 are connected via a detachable piping joint 206. The piping joint 206 is formed by joint elements that are respectively provided at an end of the branch pipe 112 and an end of the corresponding module pipe 205.

A most downstream module pipe 205 and a nozzle pipe 41 that is connected to a nozzle 40 of a processing unit 16 are connected via a detachable piping joint 207. The piping joint 207 is formed by joint elements that are respectively provided at an end of the nozzle pipe 41 and an end of the corresponding module pipe 205.

The illustrated supply control module 200 has one on-off valve 202, one flow meter 203, one flow control valve 204, and one piping joint 206. However, the present invention is not limited to this. In a case where two or more types of processing liquids can be discharged from one nozzle 40, the supply control module 200 receives supply of processing liquids of different types from two or more branch pipes 112. In this case, for example, the supply control module 200 is provided with two or more joint elements for forming two or more piping joints 206, and is further provided with a fluid control device such as a three-way valve or a mixing valve as a fluid control device for switching or mixing of the processing liquids.

The on-off valve 202 included in the supply control module 200 is formed of an air-operated valve that opens or closes according to application or non-application (ON/OFF) of pressurized air to a pilot port. An air pipe (202a) is connected to the pilot port of the on-off valve 202.

The flow control valve 204 included in the supply control module 200 is structured as a constant pressure valve that can change a setting value of a valve-outlet pressure by changing a pressure (pilot pressure) of pressurized air introduced to the pilot port. As a result of changing the valve-outlet pressure, a flow rate of a processing liquid discharged from the nozzle 40 can be adjusted. An air pipe (204a) is connected to a pilot port of the flow control valve 204.

Figure 6:
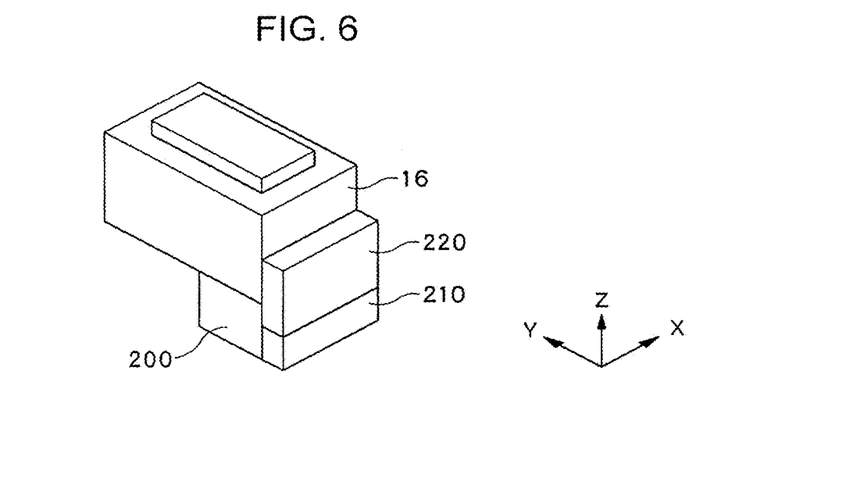
FIG. 6 is a schematic perspective view illustrating an assembly that includes a processing unit, a supply control module, and first and second drive equipment boxes.

As illustrated in FIGS. 3 and 6, a first drive equipment box 210 is provided behind a row of supply control modules 200 aligned in the X direction. As illustrated in FIG. 5, in the first drive equipment box 210, multiple (in a number at least equal to a total number of on-off valves 202 included in all supply control modules 200 attached to one processing unit 16) control air supply pipes 212 that are connected in parallel to a pressurized air supply source 211 are provided. A solenoid valve 213 is interposed in each of the control air supply pipes 212. When the solenoid valve 213 is opened, pressurized air for control is supplied through a corresponding control air supply pipe 212 to an air pipe (202a) of a corresponding on-off valve 202, and the on-off valve 202 is brought into an open state.

The multiple control air supply pipes 212 merge into one pipe 214 on an upstream side. The pressurized air supply source 211 is connected to the one pipe 214 via a detachable piping joint 215.

A control air supply pipe 212 and an air pipe (202a) of a corresponding on-off valve 202 are connected via a detachable piping joint 208. The piping joint 208 is formed by joint elements that are respectively provided at an end of the control air supply pipe 212 and an end of the corresponding air pipe (202a).

A second drive equipment box 220 is provided behind a back face of the processing unit 16 and above the first drive equipment box 210. In the second drive equipment box 220, multiple (in a number at least equal to a total number of flow control valves 204 included in all supply control modules 200 attached to one processing unit 16) control air supply pipes 222 that are connected in parallel to a pressurized air supply source 221 are provided. An electro-pneumatic regulator 223 is interposed in each of the control air supply pipes 222. Through each of the control air supply pipes 222, pressurized air for control pressure-controlled by a corresponding electro-pneumatic regulator 223 is supplied to a corresponding flow control valve 204.

The multiple control air supply pipes 222 merge into one pipe 224 on an upstream side. The pressurized air supply source 221 is connected to the one pipe 224 via a detachable piping joint 225.

A control air supply pipe 222 and an air pipe (204a) of a flow control valve 204 are connected via a detachable piping joint 209. The piping joint 209 is formed by joint elements that are respectively provided at an end of the control air supply pipe 222 and an end of the corresponding air pipe (204a).

In the second drive equipment box 220, a controller 226 is also provided that controls the electro-pneumatic regulator 223 based on a detection signal transmitted from the flow meter 203. A signal line (203a) connected to the flow meter 203 and a signal line (224a) connected to the controller 226 are connected via a detachable signal joint 235.

The first drive equipment box 210 and the second drive equipment box 220 form a drive part that drives the on-off valve 202 and the flow control valve 204, which are fluid control devices (devices that control flow of a processing liquid by acting on the processing liquid) included in the supply control module 200.

The first drive equipment box 210 and the second drive equipment box 220 are mounted to a chamber (processing unit housing) 20 of the processing unit 16. A method for the mounting is arbitrary. For example, the mounting can be performed by screw fixing and the like.

Since the first drive equipment box 210 is mounted to the back of the row of the supply control modules 200, in order to allow a worker to easily access the supply control modules 200 during maintenance, it is also preferable to mount the first drive equipment box 210 to the processing unit 16 such that the first drive equipment box 210 can be rotated about a horizontal axis via a hinge 216 (see FIG. 3).

When a worker manufactures the substrate processing system 1 in a manufacturing factory, at an installation site of the substrate processing system 1 (that is, a place where the substrate processing system 1 is assembled in the manufacturing factory), the tank 102, the main supply pipe 104, the pump 106, the filter 108 and other auxiliaries of the processing liquid supply device 70 are placed in a frame inside a housing of the substrate processing system 1 (in a casing in which various units are mounted). In addition, an exhaust duct connected to a factory exhaust system and various devices attached to it, a drain pipe connected to factory waste liquid system and various devices attached to it, substrate transfer devices (13, 17), control devices such as a computer, and the like are placed inside the frame of the substrate processing system 1.

At a place away from the installation site, a worker who assembles processing units assembles multiple supply control modules 200, a first drive equipment box 210 and a second drive equipment box 220, corresponding to one processing unit 16, and thereby, an assembly 230 (FIG. 6) is formed.

When the assembly 230 is formed by the worker, first, the supply control module 200 is inserted into the slot 23 of the bottom plate 22 of the processing unit 16 (FIG. 3), and then the first drive equipment box 210 and the second drive equipment box 220 are mounted to the processing unit 16, and the state of FIG. 6 is achieved.

Next, necessary pipes and signal lines are connected. That is, the pipes associated with one processing unit 16 are connected by the piping joints (207, 208, 209), and the signal wirings by the signal joints 235. The piping joints (206, 215, 225) remain as being removed.

In this state, the supply control module 200 corresponding to the one processing unit 16 can be inspected. In the inspection, test gas supply sources (not illustrated in the drawings) are respectively connected to the joint element on the first drive equipment box 210 side of the piping joint 215 and the joint element on the second drive equipment box 220 side of the piping joint 225. Further, a test liquid supply source (for example, a pure water supply source) is connected to the joint element on the supply control module 200 side of the piping joint 206.

Further, instead of a control device 4, a test control part that controls operation of the assembly 230 is connected. The test control part is, for example, a computer that outputs a control signal. The test control part can at least cause the solenoid valve 213, the electro-pneumatic regulator 223 and the controller 226 to operate by outputting a control signal. In this state, by causing the solenoid valve 213, the electro-pneumatic regulator 223 and the controller 226 to operate, a single unit operation test of the assembly 230 can be performed. To be confirmed by the single unit operation test include whether or not a test liquid is supplied from the nozzle 40 as intended and whether or not a defect (such as a leak) is present in various parts included in the supply control module 200 and connection parts thereof.

In order to cause the solenoid valve 213, the electro-pneumatic regulator 223 and the controller 224 to operate, it is sufficient to transmit appropriate control signals to these parts. A method for transmitting control signals is arbitrary. Various methods can be adopted such as a method of directly inputting control signals to these parts (when these parts have signal input terminals that can be used for such intended use) or a method of inputting control signals to these parts via a subordinate controller (that operates according to a command of the control device 4 as a superior controller) provided in the processing unit 16. The test gas supply source, the test liquid supply source, and the test control part form test equipment for controlling the operation of the assembly 230 to perform the single unit operation test.

Upon completion of the single unit operation test, the test equipment is removed from the assembly 230 and the assembly 230 is assembled to the frame (not illustrated in the drawings) inside the housing of the substrate processing system 1. Then, the joint element of the control air supply pipe 212 corresponding to the joint element of the piping joint 206 on the side of each of the supply control modules 200 is connected. Further, pressurized air supply sources (211, 221) are respectively connected to the joint element on the first drive equipment box 210 side of the piping joint 215 and the joint element on the second drive equipment box 220 side of the piping joint 225.

When necessary equipment including the assembly 230 is assembled to the frame of the substrate processing system 1, operation conformation of the entire substrate processing system 1 can be performed.

According to the above embodiment, a processing liquid supply controller (which includes, for example, multiple supply control modules 200) dedicated to one processing unit 16 for controlling discharge of processing liquids from all the nozzles 40 included in the one processing unit 16 is provided, and this processing liquid supply controller is isolated and independent from processing liquid supply controllers for other processing units. Further, the first drive equipment box 210 and the second drive equipment box 220, which are a drive part for causing the processing liquid supply controller dedicated to one processing unit 16 to operate, are provided dedicated to the processing liquid supply controller dedicated to the one processing unit 16, and the drive part thereof is also isolated and independent from drive parts for other processing units.

Therefore, multiple assemblies 230, each of which includes one processing unit 16 and a processing liquid supply controller and a drive part that correspond to the one processing unit 16, can be concurrently assembled in separate places. Therefore, time required for manufacturing the substrate processing system 1 can be greatly shortened. When the processing liquid supply controller or the drive part is shared by multiple processing units, the assemblies 230 cannot be assembled in separated places and thus the above-described shortening of installation time is not possible. Further, even when the processing liquid supply controller or the drive part is not shared by multiple processing units, when portions corresponding to the processing units are not divided, the assemblies 230 cannot be assembled in separated places and thus the above-described shortening of installation time is not possible.

In an embodiment of the present embodiment, connections of the piping joints (206, 207, 208, 209) corresponding to the processing units 16 are concurrently performed in separate work spaces, and then the processing units 16 (assemblies 230) are assembled to the frame. Therefore, the assembling time of the substrate processing system 1 can be shortened by an amount of work time shortened by performing concurrent work.

A single unit operation test of one assembly 230 can be performed by connecting test equipment to the one assembly 230. Therefore, whether or not equipment that forms a processing liquid supply system included in the assembly 230 normally operates can be inspected before the assembly 230 is assembled to the frame of the substrate processing system 1. Therefore, inspections of the assemblies 230 can be concurrently performed. Therefore, inspection time can be greatly shortened. Further, since inspection with respect to many inspection items can be performed with a single assembly 230, the inspection can be performed in a wide work space, and shortening of the inspection time and improvement in inspection accuracy can be achieved.

In an embodiment of the present embodiment, the first drive equipment box 210 and the second drive equipment box 220 are also provided dedicated to the processing liquid supply controller dedicated to the one processing unit 16 and thus, as described above, inspections of the assemblies 230 can be concurrently performed before the assemblies 230 are assembled to the frame.

The types of the processing liquids used in the substrate processing system 1 are not limited, and various processing liquids applicable in wet etching processing, cleaning processing and the like that are used in semiconductor device manufacturing can be used. Further, types of substrates to be processed by the substrate processing system 1 are not limited, and various types of substrates such as a semiconductor wafer, a glass substrate for an LCD, a ceramic substrate, and the like can be processed by the substrate processing system 1.

In the above embodiment, a processing liquid is distributed to the multiple processing units 16 respectively via the multiple branch pipes 112 branching from the main supply pipe 104 as a circulation line connected to the tank 102 of the processing liquid supply device 70. However, the present invention is not limited to such a structure. It is also possible that a processing liquid is directly supplied to the multiple processing units 16, from a tank that stores the processing liquid, respectively via multiple processing liquid direct supply pipes. In this case, the processing liquid direct supply pipes are respectively connected to the corresponding supply control modules 200.

In the above description, the supply of the processing liquids to the processing units 16 is described. However, materials to be supplied to the processing units 16 are not limited to liquids, but may also be processing gases (such as a nitrogen gas). That is, the structure in which the processing liquid supply controller dedicated to one processing unit 16, the first drive equipment box and the second drive equipment box are provided can also be applied to a case where, instead of a processing liquid, a processing gas is supplied to the processing unit 16. In this case, in the above description, the term "processing liquid" may be read as "processing gas" or "processing fluid."

In a manufacturing factory that manufactures a substrate processing system, after multiple liquid processing units are set in a housing of the substrate processing system, devices, modules, pipes and the like that form a processing liquid supply part are connected to the liquid processing units. In this case, inspection is performed as to whether or not a processing liquid is appropriately supplied from the processing liquid supply part to the liquid processing units and whether or not a leak of the processing liquid occurs. Since there is not enough work space for a large number of workers to concurrently perform the above work, it is not possible to concurrently perform the above work with respect to the multiple liquid processing units. Therefore, it takes a long time to complete the work.

The time required for manufacturing a substrate processing apparatus according to an embodiment of the present invention can be shortened.

According to an embodiment of the present invention, a substrate processing apparatus is provided that includes multiple substrate processing units that each perform processing by supplying a processing fluid to a substrate; multiple processing fluid supply control parts that are associated in a one-to-one correspondence with the multiple substrate processing units and each include fluid control devices that control flow of a processing fluid supplied to the substrate processing units by acting on the processing fluid; and multiple drive parts that are associated in one-to-one correspondence with the multiple processing fluid supply control parts and each include driving equipment that causes the fluid control devices of the corresponding processing fluid supply control part to operate. In the substrate processing apparatus, each of the substrate processing units and the corresponding processing fluid supply control part and drive part form an assembly.

According to an embodiment of the present invention, the time required for manufacturing a substrate processing apparatus can be greatly shortened.

A substrate processing apparatus according to one aspect of the present invention includes: a substrate processing device that performs processing by supplying a processing fluid to a substrate; a processing fluid supply control device that includes a fluid control device that controls flow of the processing fluid supplied to the substrate processing device; and a drive device that includes drive equipment that causes the fluid control device of the processing fluid supply control device to operate. The substrate processing device, the processing fluid supply control device, and the drive device form an assembly. Multiple assemblies are provided.

A substrate processing apparatus assembling method according to another aspect of the present invention includes: forming multiple assemblies, each of the assemblies being formed from a substrate processing device of a structure that performs processing by supplying a processing fluid to a substrate, a processing fluid supply control device that includes a fluid control device of a structure that controls flow of the processing fluid supplied to the substrate processing device, and a drive device that includes drive equipment that causes the fluid control device of the processing fluid supply control device to operate; inspecting the multiple assemblies by connecting test equipment of a structure that controls operation of each of the multiple assemblies to each of the assemblies; and assembling the multiple assembly that have been inspected by the test equipment to a frame to assemble a substrate processing apparatus.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate processing system, comprising:
a plurality of assemblies framed and comprising such that each of the assemblies comprises a substrate processing apparatus configured to supply a processing fluid to a substrate and process the substrate, a fluid supply control apparatus comprising a fluid control device configured to control flow of the processing fluid supplied to the substrate processing apparatus, and a drive equipment apparatus comprising a drive device configured to drive the fluid control device in the fluid supply control apparatus,
wherein the substrate processing apparatus has a chamber and a bottom plate comprising a holding portion configured to engage with the fluid supply control apparatus and hold the fluid supply control apparatus on the bottom plate of the substrate processing apparatus such that the fluid control device is connected to the substrate processing apparatus and dedicated to control the flow of the processing fluid supplied to the substrate processing apparatus in a respective one of the assemblies, the drive equipment apparatus is encased independently from the substrate processing apparatus and the fluid supply control apparatus such that the drive equipment apparatus is configured to be mounted directly on the chamber of the substrate processing apparatus and that the drive device is connected to the fluid control device in the fluid supply control apparatus and dedicated to drive the fluid control device in the fluid supply control apparatus in the respective one of the assemblies, and the drive equipment apparatus comprises a first drive equipment box configured to be connected to the fluid supply control apparatus and a second drive equipment box configured to be connected to the fluid supply control apparatus and mounted to the first drive equipment box such that the first and second drive equipment boxes are configured to be mounted on the chamber of the substrate processing apparatus.

2. A substrate processing system according to claim 1, wherein the first drive equipment box and the second drive equipment box are configured to drive an on-off valve and a flow control valve in the fluid supply control apparatus.

3. A substrate processing system according to claim 2, wherein the drive equipment apparatus is positioned adjacent to the fluid supply control apparatus on the chamber of the substrate processing apparatus in each of the assemblies.

4. A substrate processing system according to claim 3, wherein the fluid supply control apparatus comprises a plurality of supply control modules such that each of the supply control modules includes a base plate and the fluid control device positioned on the base plate.

5. A substrate processing system according to claim 4, wherein the substrate processing apparatus has a base plate holding device formed in the bottom plate of the substrate processing apparatus such that the base plate holding device is configured to hold a plurality of base plates in parallel in an upright position.

6. A substrate processing system according to claim 5, wherein the base plate has an overhanging portion, and the base plate holding device has a plurality of slot portions configured to support a plurality of overhanging portions, respectively, when the overhanging portion of the base plate is inserted into one of the slot portions.

7. A substrate processing system according to claim 3, further comprising:
a main supply pipe configured to supply the processing fluid from a processing fluid supply source to a plurality of substrate processing apparatuses such that the main supply pipe distributes the processing fluid to a plurality of fluid supply control apparatuses,
wherein the plurality of substrate processing apparatuses is positioned such that the substrate processing apparatuses are arrayed in a first direction in a horizontal direction, and the main supply pipe is formed such that the main supply pipe is extending on a lower side of the plurality of substrate processing apparatuses in the first direction.

8. A substrate processing system according to claim 2, wherein the fluid supply control apparatus comprises a plurality of supply control modules such that each of the supply control modules includes a base plate and the fluid control device positioned on the base plate.

9. A substrate processing system according to claim 8, wherein the substrate processing apparatus has a base plate holding device formed in the bottom plate of the substrate processing apparatus such that the base plate holding device is configured to hold a plurality of base plates in parallel in an upright position.

10. A substrate processing system according to claim 9, wherein the base plate has an overhanging portion, and the base plate holding device has a plurality of slot portions configured to support a plurality of overhanging portions, respectively, when the overhanging portion of the base plate is inserted into one of the slot portions.

11. A substrate processing system according to claim 2, further comprising:
a main supply pipe configured to supply the processing fluid from a processing fluid supply source to a plurality of substrate processing apparatuses such that the main supply pipe distributes the processing fluid to a plurality of fluid supply control apparatuses,
wherein the plurality of substrate processing apparatuses is positioned such that the substrate processing apparatuses are arrayed in a first direction in a horizontal direction, and the main supply pipe is formed such that the main supply pipe is extending on a lower side of the plurality of substrate processing apparatuses in the first direction.

12. A substrate processing system according to claim 1, wherein the fluid supply control apparatus and the drive equipment apparatus are fixed onto the substrate processing apparatus in each of the assemblies such that the drive equipment apparatus is mounted on a back surface of the chamber of the substrate processing apparatus.

13. A substrate processing system according to claim 1, wherein the fluid supply control apparatus comprises a plurality of supply control modules such that each of the supply control modules includes a base plate and the fluid control device positioned on the base plate.

14. A substrate processing system according to claim 13, wherein the holding portion of the bottom plate in the substrate processing apparatus has a base plate holding device formed in a lower portion of the substrate processing apparatus such that the base plate holding device is configured to hold a plurality of base plates in parallel in an upright position.

15. A substrate processing system according to claim 14, wherein the base plate has an overhanging portion, and the base plate holding device has a plurality of slot portions configured to support a plurality of overhanging portions, respectively, when the overhanging portion of the base plate is inserted into one of the slot portions.

16. A substrate processing system according to claim 1, further comprising:
a main supply pipe configured to supply the processing fluid from a processing fluid supply source to a plurality of substrate processing apparatuses such that the main supply pipe distributes the processing fluid to a plurality of fluid supply control apparatuses,
wherein the plurality of substrate processing apparatuses is positioned such that the substrate processing apparatuses are arrayed in a first direction in a horizontal direction, and the main supply pipe is formed such that the main supply pipe is extending on a lower side of the plurality of substrate processing apparatuses in the first direction.

17. A method for assembling a substrate processing system, comprising:
forming a plurality of assemblies such that each of the assemblies comprises a substrate processing apparatus configured to supply a processing fluid to a substrate and process the substrate, a fluid supply control apparatus comprising a fluid control device configured to control flow of the processing fluid supplied to the substrate processing apparatus, and a drive equipment apparatus comprising a drive device configured to drive the fluid control device in the fluid supply control apparatus;

connecting, to each of the assemblies, a test equipment device configured to control operation of each of the assemblies such that each of the assemblies is inspected; and assembling the plurality of assemblies inspected by the test equipment device onto a frame structure such that a substrate processing system comprising the plurality of assemblies is assembled, wherein the substrate processing apparatus has a chamber and a bottom plate comprising a holding portion configured to engage with the fluid supply control apparatus and hold the fluid supply control apparatus on the bottom plate of the substrate processing apparatus such that the fluid control device is connected to the substrate processing apparatus and dedicated to control the flow of the processing fluid supplied to the substrate processing apparatus in a respective one of the assemblies, the drive equipment apparatus is encased independently from the substrate processing apparatus and the fluid supply control apparatus such that the drive equipment apparatus is configured to be mounted directly on the chamber of the substrate processing apparatus and that the drive device is connected to the fluid control device in the fluid supply control apparatus and dedicated to drive the fluid control device in the fluid supply control apparatus in the respective one of the assemblies, and the drive equipment apparatus comprises a first drive equipment box configured to be connected to the fluid supply control apparatus and a second drive equipment box configured to be connected to the fluid supply control apparatus and mounted to the first drive equipment box such that the first and second drive equipment boxes are configured to be mounted on the chamber of the substrate processing apparatus.

18. A method for assembling a substrate processing system according to claim 17, wherein the first drive equipment box and the second drive equipment box are configured to drive an on-off valve and a flow control valve in to the fluid supply control apparatus.

19. A method for assembling a substrate processing system according to claim 18, wherein the forming of the assemblies comprises positioning the drive equipment apparatus adjacent to the fluid supply control apparatus for each of the assemblies.

20. A method for assembling a substrate processing system according to claim 18, wherein the forming of the assemblies comprises fixing the fluid supply control apparatus and the drive equipment apparatus onto the chamber of the substrate processing apparatus for each of the assemblies.

* * * * *